US006806497B2

(12) United States Patent
Jo

(10) Patent No.: US 6,806,497 B2
(45) Date of Patent: Oct. 19, 2004

(54) ELECTRONIC DEVICE, METHOD FOR DRIVING THE ELECTRONIC DEVICE, ELECTRO-OPTICAL DEVICE, AND ELECTRONIC EQUIPMENT

(75) Inventor: Hiroaki Jo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/388,810

(22) Filed: Mar. 17, 2003

(65) Prior Publication Data

US 2004/0108518 A1 Jun. 10, 2004

(30) Foreign Application Priority Data

Mar. 29, 2002 (JP) ....................................... 2002-097290

(51) Int. Cl.[7] ................................................ H01L 29/04
(52) U.S. Cl. ............................ 257/59; 257/72; 345/212
(58) Field of Search ....................... 257/59, 72; 345/212

(56) References Cited

U.S. PATENT DOCUMENTS

2002/0125831 A1 * 9/2002 Inukai et al. ............ 315/169.3

FOREIGN PATENT DOCUMENTS

| | | |
|---|---|---|
| EP | 0 905 673 A1 | 3/1999 |
| JP | 59-181882 | 10/1984 |
| JP | A-10-254410 | 9/1998 |
| JP | 11-219146 | 8/1999 |
| JP | A-2000-187467 | 7/2000 |
| JP | A-2000-348861 | 12/2000 |
| JP | 2001-350442 | 12/2001 |
| JP | A-2002-278513 | 9/2002 |
| JP | 2003-173154 | 6/2003 |
| JP | 2003-216100 | 7/2003 |
| WO | WO98/36406 | 8/1998 |
| WO | WO98/40871 | 9/1998 |

* cited by examiner

*Primary Examiner*—David Nelms
*Assistant Examiner*—Tu-Tu Ho
(74) *Attorney, Agent, or Firm*—Oliff & Berridge, PLC

(57) ABSTRACT

The invention provides an electronic circuit, electronic device, method of driving the electronic circuit, electro-optical device, and electronic equipment to detect operational characteristics of the electronic circuit at a high precision. A pixel circuit includes a switching transistor connected between a driving transistor and organic EL element, and detecting transistor for supplying a current detecting circuit with a driving current output by the driving transistor. A holding capacitor is supplied with test data voltage Vdata by turning on a switching transistor with the switching transistor turned off. The current detecting circuit is supplied with a driving current from the driving transistor through the detecting transistor by turning on the detecting transistor with the switching transistor turned off. The current detecting circuit thus detects the driving current in response to the test voltage Vdata.

15 Claims, 7 Drawing Sheets

ELECTRONIC DEVICE, METHOD FOR DRIVING THE ELECTRONIC DEVICE, ELECTRO-OPTICAL DEVICE, AND ELECTRONIC EQUIPMENT

BACKGROUND OF THE INVENTION

1. Field of Invention

The present invention relates to an electronic circuit, electronic device, method of driving the electronic circuit, electro-optical device, and electronic equipment.

2. Description of Related Art

In the related art, electro-optical devices employing an organic EL element can be used as a display. The electro-optical device employing the organic EL element uses an active-matrix addressing method as one of various driving methods.

In the active-matrix addressed electro-optical device, pixel circuit is arranged for each organic EL element to control luminance of the EL element. The luminance gradation of the organic EL element is controlled by supplying a holding capacitor of the pixel circuit with a data signal (in voltage value or current value) responsive to the luminance gradation. Namely, the holding capacitor is charged with an electric charge responsive to a set luminance gradation.

The conduction state of a driving TFT (Thin-Film Transistor) is set in response to an amount of electric charge held in the holding capacitor, and a current in accordance with the conduction state is fed to the organic EL element, as disclosed in PCT Publication WO98/36406.

SUMMARY OF THE INVENTION

The pixel circuit includes at least one active element, such as a transistor, and it is difficult to cause all active-elements to have strictly uniform characteristics. In particular, a thin-film transistor (TFT) forming a pixel circuit of a display is subject to large variations in characteristics. For this reason, it is difficult to achieve a desired luminance in response to a predetermined input signal.

Characteristics of the display also vary with the aging of an active element forming the pixel circuit or electro-optical device.

The present invention addresses or overcomes the above and/or other problems, and provides an electronic circuit, electronic device, method of driving the electronic circuit, electro-optical device, and electronic equipment to detect operational characteristics of the electronic circuit at a high precision.

A first electronic device of the present invention includes a plurality of unit circuits. Each of the unit circuits includes a first transistor, a holding element to hold an electrical signal, supplied through the first transistor, as an amount of electricity, a second transistor, the conduction state of which is controlled in accordance with the amount of electricity held by the holding element, a driven element which is supplied with an amount of current in response to the conduction state, and a third transistor which is connected in series with the second transistor. The electronic device is connected through the third transistor to a tester which detects the amount of current.

By turning on the third transistor, the amount of current responsive to the amount of electric charge from the second transistor to be supplied to the driven element is obtained through the third transistor. The operational characteristics of the electronic circuit are thus detected. The third transistor may be arranged in each of the unit circuits, or may be shared by several of the plurality of unit circuits.

A second electronic device of the present invention includes a plurality of unit circuits. Each of the unit circuits includes a first transistor, a holding element to hold an electrical signal, supplied through the first transistor, as an amount of electricity, a second transistor, the conduction state of which is controlled in accordance with the amount of electricity held by the holding element, and a driven element which is supplied with an amount of current responsive to the conduction state. The second transistor is connected in series with the first transistor, and wherein the electronic device is connected through the first transistor to a tester which detects the amount of current.

An exemplary embodiment corresponding to the second electronic device is a fourth exemplary embodiment discussed subsequently. The electronic device has a circuit arrangement supplied with a current signal as the electrical signal.

In the electronic device, a fourth transistor is connected between the driven element and the second transistor.

With this arrangement, one of the third transistor and the first transistor is turned on with the fourth transistor turned off to cut off the supply of a current to the driven element, and thus the amount of current flowing through the second transistor to be supplied to the driven element can be detected using the one of the third transistor and the first transistor. During the current detection period of the tester, at least the fourth transistor preferably remains in an off state.

In the above electronic device, the driven element may be a current driven element, such as an organic EL element. A light emission layer of the organic EL element is fabricated of an organic material.

In the electronic device, the third transistor is preferably arranged in each of the unit circuits. With this arrangement, the current characteristics of each of the plurality of unit circuits are detected.

In the electronic device, the holding element may be a capacitive element that holds, as an electric charge, an electrical signal supplied to each of the plurality of unit circuits.

In the electronic device, the holding element may be a memory element, such as an SRAM.

The electronic device includes a memory circuit which stores a correction value to an electrical signal fed through the first transistor and determined by the tester.

With this arrangement, the correction value stored in the memory circuit is used to correct the operational characteristics of the electronic device, and the operation of the driven element is thus adjusted.

A driving method of the present invention of driving an electronic device including a first transistor, a holding element to hold an electrical signal, supplied through the first transistor, as an amount of electricity, a second transistor, the conduction state of which is controlled in accordance with the amount of electricity held by the holding element, a driven element which is supplied with an amount of current responsive to the conduction state, and a third transistor connected in series with the second transistor, includes: holding the amount of electricity on the holding element based on the electrical signal by turning on the first transistor, and detecting the amount of current flowing through a current passage containing the second transistor and the third transistor with the third transistor turned on to electrically connect the second transistor through the third transistor to a tester to detect the amount of current.

With this arrangement, the tester can detect the amount of current to be supplied to the driven element.

In the driving method of driving the electronic device, preferably, the current passage excludes the driven element.

In the driving method of driving the electronic device, the driven element may be a current driven element, such as an organic EL element.

A first electro-optical device of the present invention includes a plurality of pixel circuits, each pixel circuit arranged at an intersection of each of a plurality of scanning lines and each of a plurality of data lines, and the pixel circuit includes a first transistor, the conduction of which is controlled by a scanning signal supplied through a corresponding scanning line of the plurality of scanning lines, a holding element which holds, as an amount of electricity, a data signal supplied through a corresponding data line of the plurality of data lines and the first transistor, a second transistor, the conduction state of which is controlled by the amount of electricity held by the holding element, an electro-optical element supplied with an amount of current responsive to the conduction state, and a third transistor connected in series with the second transistor. Each of the plurality of pixel circuits is connected through the third transistor to a tester which detects the amount of current.

In the electro-optical device, the third transistor may be arranged in each of the unit circuits, or may be shared by several of the plurality of unit circuits.

In the electro-optical device, the third transistor may be connected to the tester through data lines corresponding to the plurality of transistors. With this arrangement, the data line can be used as a test line without arranging a dedicated test line.

A second electro-optical device of the present invention includes a plurality of pixel circuits, each pixel circuit being arranged at an intersection of each of a plurality of scanning lines and each of a plurality of data lines. Each pixel circuit includes a first transistor, the conduction of which is controlled by a scanning signal supplied through a corresponding scanning line of the plurality of scanning lines, a holding element which holds, as an amount of electricity, a data signal supplied through a corresponding data line of the plurality of data lines and the first transistor, a second transistor, the conduction state of which is controlled by the amount of electricity held by the holding element, the second transistor connected in series with the first transistor, and an electro-optical element supplied with an amount of current responsive to the conduction state. Each of the plurality of pixel circuits is connected through the first transistor to a tester which detects the amount of current.

In the electro-optical device, the tester includes a current detecting circuit to detect the amount of current, a correction value calculating circuit to determine a correction value to the electrical signal based on the amount of current detected by the current detecting circuit, and a memory circuit to store the correction value to the pixel circuit. In setting the electrical signal, the electrical signal is corrected by the correction value.

In this arrangement, the correction value calculating circuit determines a correction value to adjust variations in the operational characteristics of the pixel circuit, and the memory circuit stores the correction value to the pixel circuit. The operational characteristics of the pixel circuit are corrected in accordance with the correction value to the electronic circuit stored in the memory circuit, and the operation of the driven element can be thus adjusted.

Electronic equipment of the present invention incorporates one of the above-described electro-optical devices.

DETAILED DESCRIPTION OF PREFERRED EXEMPLARY EMBODIMENTS (First Exemplary Embodiment)

A first exemplary embodiment embodying the present invention is discussed with reference to FIG. 1–FIG. 5.

Figure 1:
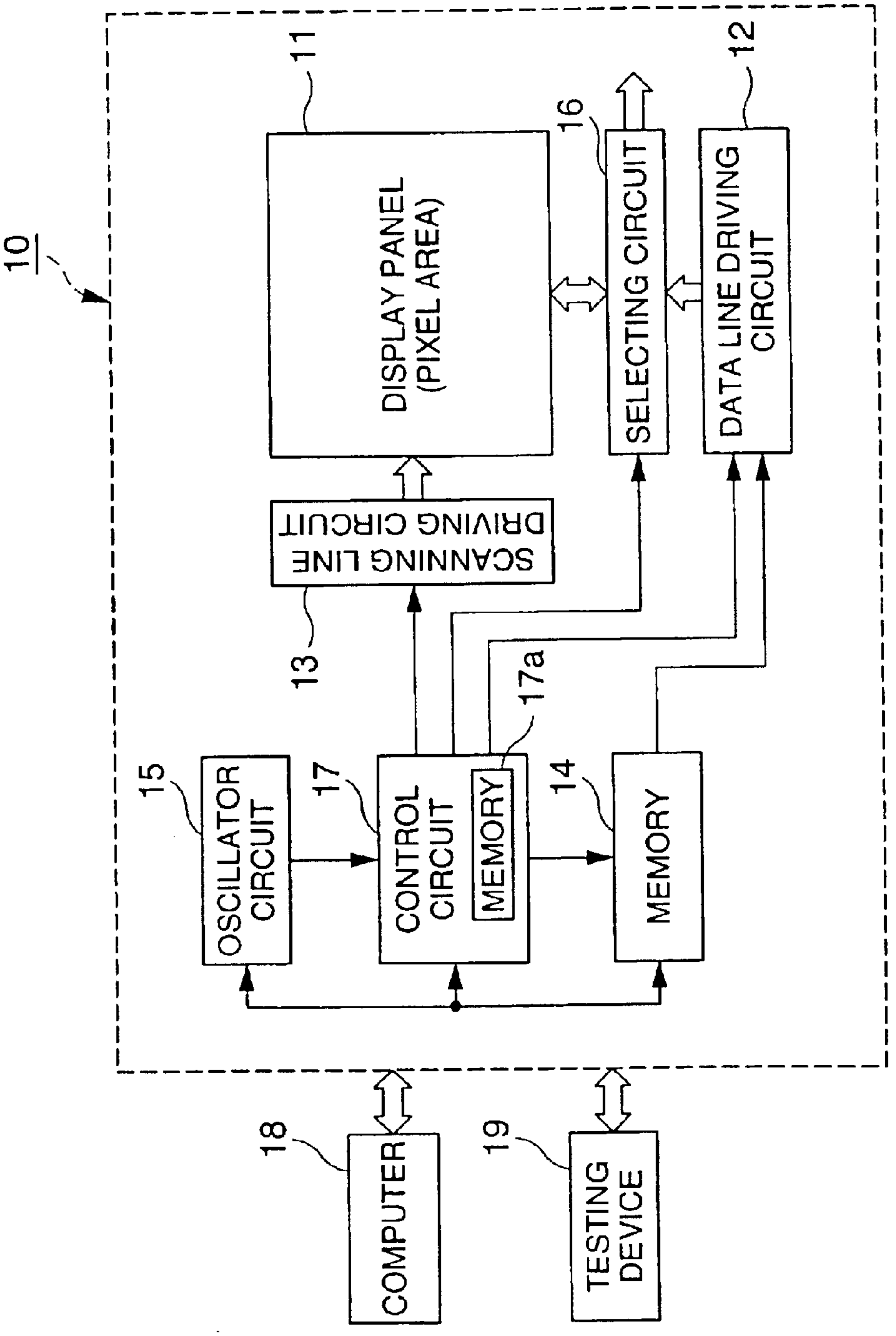
FIG. 1 is a schematic showing a circuit arrangement of an organic EL display of one exemplary embodiment of the present invention.
Figure 2:
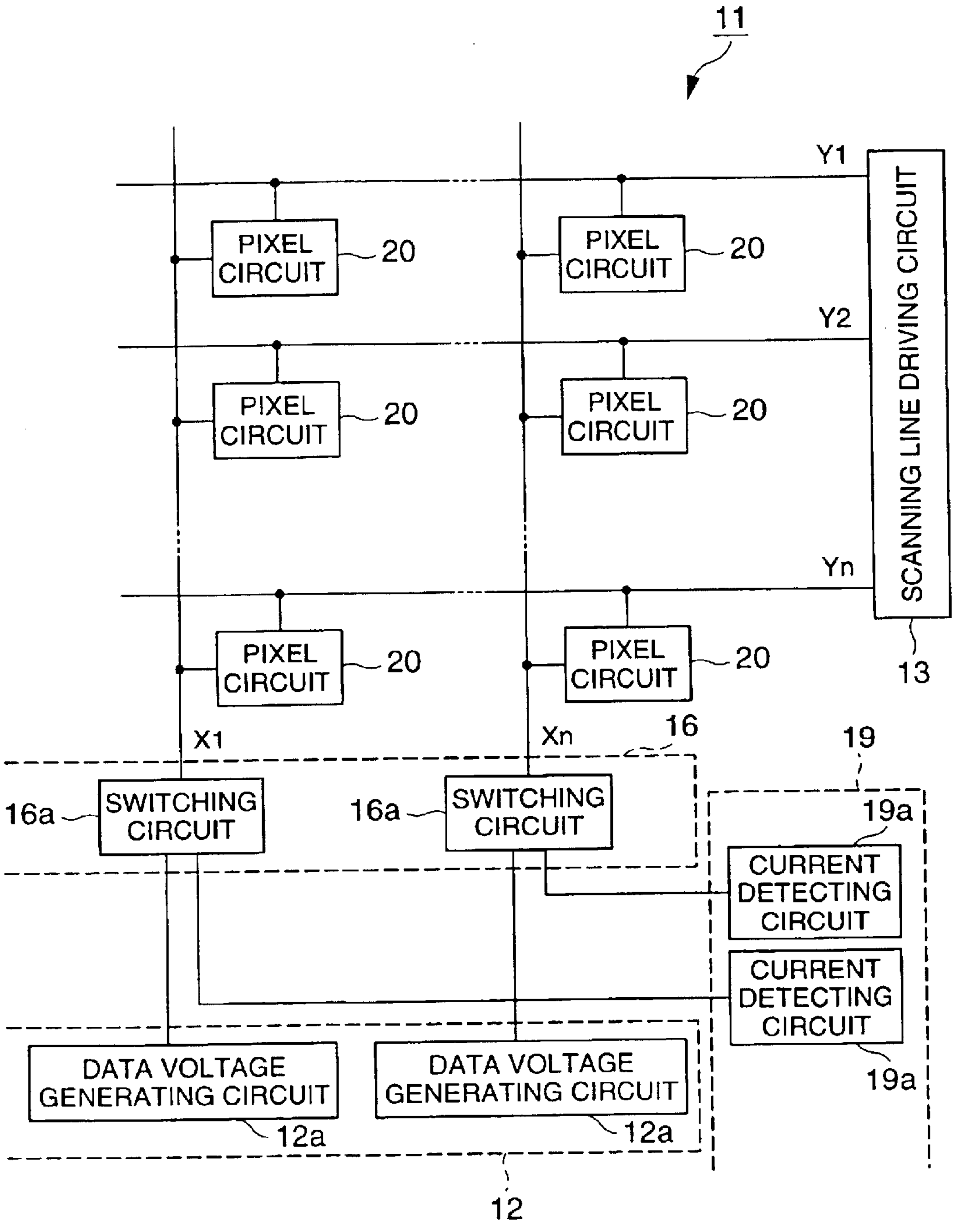
FIG. 2 is a schematic showing an internal circuit arrangement of a display panel and data line driving circuit.
Figure 3:
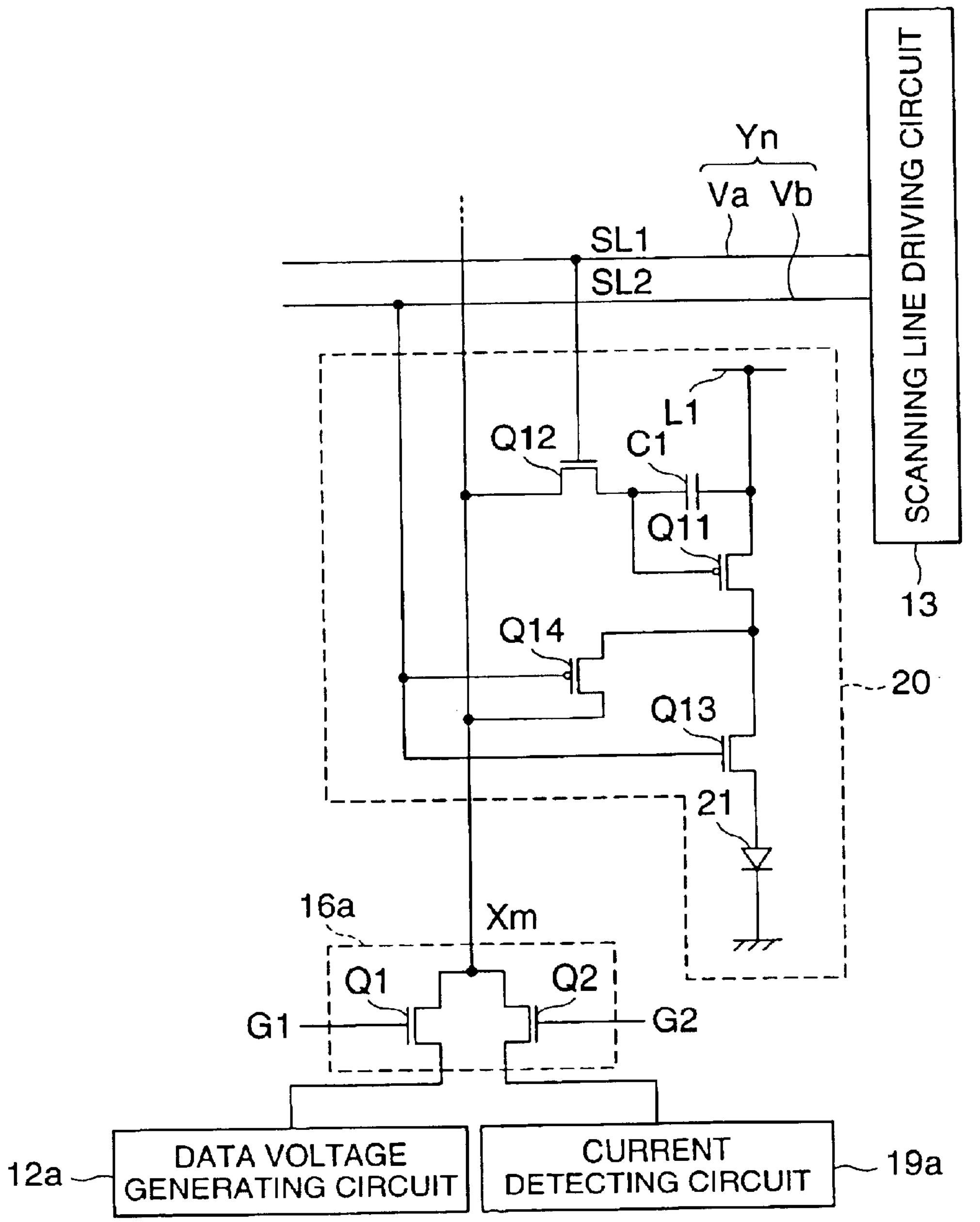
FIG. 3 is a schematic showing an internal circuit arrangement of a pixel circuit.

FIG. 1 is a schematic illustrating a circuit arrangement of an organic EL display 10 as an electro-optical device. FIG. 2 is a schematic illustrating an internal circuit arrangement of a display panel and data line driving circuit. FIG. 3 is a schematic illustrating an internal circuit arrangement of a pixel circuit.

As shown in FIG. 1, the organic EL display 10 includes a display panel 11, data line driving circuit 12, scanning line driving circuit 13, memory 14, oscillator circuit 15, selecting circuit 16, and control circuit 17.

Components 11–17 in the organic EL display 10 may be respectively formed of discrete electronic components. For example, the components 12–17 may be formed of one-chip semiconductor integrated device. Alternatively, some or all of the components 11–17 may be formed as an integrated electronic device. For example, the data line driving circuit 12 and scanning line driving circuit 13 may be integrated with the display panel 11. Some or all of the components 12–16 may be formed of a programmable IC chip, and the function thereof is achieved using a software program written onto the IC chip.

As shown in FIG. 2, the display panel 11 includes a plurality of pixel circuits 20 arranged in a matrix. Each pixel circuit 20 is arranged in a matrix by being connected between one of a plurality of data lines X1–Xm (m is an integer) extending in the direction of columns and one of a plurality of scanning lines Y1–Yn (n is an integer) extending in the direction of rows. Each pixel circuit 20 includes an organic EL element 21 as a driven element having a light emission layer fabricated of an organic material. Although a transistor arranged in the pixel circuit 20, discussed below, may be a silicon-based transistor, the transistor in this embodiment is made of a thin-film transistor (TFT).

The data line driving circuit 12 includes data voltage generating circuits 12*a* respectively for the data lines X1–Xm. The data voltage generating circuits 12*a* supply the pixel circuits 20 with electrical signals, e.g., data signals in this exemplary embodiment (data voltages Vdata) through the respective data lines X1–Xm. When the internal state of the pixel circuit 20 is set in accordance with the data voltage Vdata, a value of a current flowing through the organic EL element 21 is controlled accordingly. The luminance of the organic EL element 21 is thus controlled.

The scanning line driving circuit 13 selects one row of pixel circuits by selectively driving one line of the plurality of scanning lines Yn. Each of the scanning lines Y1–Yn includes a first sub-scanning line Va and a second sub-scanning line Vb. The scanning line driving circuit 13 outputs a first selection signal SL1 to the first sub-scanning line Va, while outputting a second selection signal SL2 to the second sub-scanning line Vb. The memory 14 stores display data supplied from a computer 18. The memory 14 also stores test display data supplied from a testing device 19 forming a correction value calculating circuit. The oscillator circuit 15 supplies other components constituting the organic EL display 10 with an operation standard signal.

The selecting circuit 16 is arranged between the display panel 11 and the data line driving circuit 12. The selecting circuit 16 includes a switching circuit 16*a* for each of the data lines X1–Xm. As shown in FIG. 3, the switching circuit 16*a* is composed of a first gate transistor Q1 and a second gate transistor Q2. The first gate transistor Q1 in the selecting circuit 16 connects one of data lines X1–Xm to the corresponding data voltage generating circuit 30. The second gate transistor Q2 in the selecting circuit 16 connects one of the data lines X1–Xm to a corresponding one of current detecting circuits 19*a* in the testing device 19 as the tester respectively arranged for the data lines X1–Xm. The first gate transistor Q1 and second gate transistor Q2 are turned on and off in response to first gate signal G1 and second gate signal G2 supplied from the control circuit 17, respectively.

The control circuit 17 generally controls the above-described components 11–16. The control circuit 17 converts the display data (image data) from the computer 18, stored in the memory 14, representing a display state in the display panel 11, into matrix data representing the luminance of each organic EL element 21 in emission. The matrix data includes a scanning line driving signal to successively select rows of pixel circuits one row at a time and a data line driving signal to determine a level of the data voltage Vdata setting the luminance of the organic EL element 21 in the selected row of pixel circuits. The scanning line driving signal is fed to the scanning line driving circuit 13. The data line driving signal is fed to the data line driving circuit 12.

The control circuit 17 is switched to a test mode when the organic EL display 10 tests each pixel circuit 20 in the display panel 11 using the testing device 19. During the test mode, the control circuit 17 converts test display data (image data) from the testing device 19, stored in the memory 14, into (test) matrix data representing the luminance of each organic EL element 21 in emission.

The test matrix data includes a test scanning line driving signal to successively select rows of pixel circuits one row at a time and a test data line driving signal to determine a level of test data voltage Vdata setting the test luminance of the organic EL element 21 in the selected row of pixel circuits. The test scanning line driving signal is fed to the scanning line driving circuit 13. The test data line driving signal is fed to the data line driving circuit 12. During the test mode, the control circuit 17 supplies the selecting circuit 16 with the first gate signal G1 and second gate signal G2 to test each pixel circuit 20 in the display panel 11. During a standard operation mode other than the test mode, the control circuit 17 outputs the first gate signal G1 only, thereby turning on the first gate transistor Q1 with the second gate transistor Q2 remaining turned off.

The internal circuit arrangement of the pixel circuit 20 is discussed below with reference to FIG. 3. For convenience of explanation, the pixel circuit 20, arranged at an intersection of an m-th data line Xm and an n-th scanning Yn, and connected between the data line Xm and scanning Yn, is discussed below.

is a voltage-driven pixel circuit in this exemplary embodiment, and includes the organic EL element 21 as a driven element. The pixel circuit 20 includes a driving transistor Q11 working as a second transistor, switching transistor Q12 working as a first transistor, light emission controlling transistor Q13 working as a fourth transistor, detecting transistor Q14 working as a third transistor, and holding capacitor C1 working as a holding element.

Each of the switching transistor Q12 and light emission controlling transistor Q13 is formed of an N-channel TFT, and each of the driving transistor Q11 and detecting transistor Q14 is formed of a P-channel TFT.

The driving transistor Q11 has the drain thereof connected to the anode of the organic EL element 21 through the light emission controlling transistor Q13, and the source thereof connected to a power source line L1. The holding capacitor C1 is connected between the gate of the driving transistor Q11 and the power source line L1. The gate of the driving transistor Q11 is coupled to the data line Xm through the switching transistor Q12. The drain of the driving transistor Q11 is connected to the data line Xm through the detecting transistor Q14.

The switching transistor Q12 has the gate thereof connected to the first sub-scanning line Va. The detecting transistor Q14 has the source thereof connected to the first subscanning line Va. The gates of the light emission controlling transistor Q13 and detecting transistor Q14 are connected together to the second sub-scanning line Vb.

The operation of the organic EL display 10 thus constructed is discussed below together with the operation of the pixel circuit 20.

(Standard Operation Mode)

Figure 4:
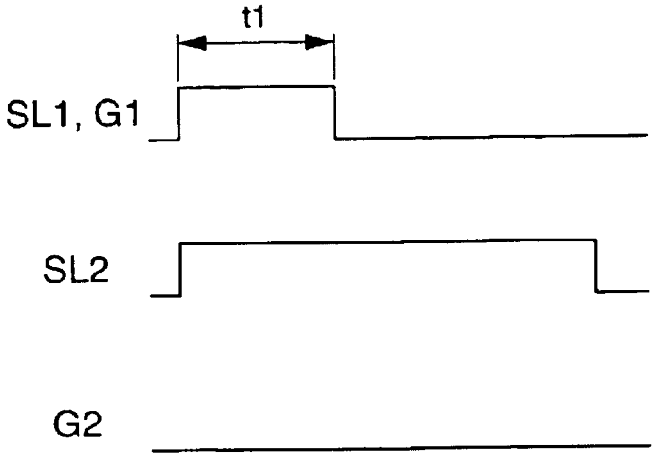
FIG. 4 is a timing diagram showing signals in a standard operation mode.

A standard operation mode is discussed with reference to a timing diagram of signals SL1, SL2, G1, and G2 shown in FIG. 4.

When the pixel circuit 20 connected to the scanning line Yn start a light emission operation with the n-th scanning line Yn selected, the scanning line driving circuit 13 outputs, through the first sub-scanning line Va of the scanning line Yn, the first selection signal SL1 for turning the switching transistor Q12 on. The switching transistor Q12 is turned on. At the same time, the control circuit 17 outputs, to the switching circuit 16*a* in the selecting circuit 16, the first gate signal G1 to turn on the first gate transistor Q1. The first gate transistor Q1 is thus turned on. With the switching transistor Q12 and first gate transistor Q1 turned on, the data voltage generating circuit 12*a* feeds the data voltage Vdata to the holding capacitor C1 of the corresponding pixel circuit 20. After time t1 has elapsed, the first selection signal SL1 and first gate signal G1 for respectively turning off the switching transistor Q12 and first gate transistor Q1 are fed to end a data write period. The data write period thus ends.

For a period of time during which the pixel circuit 20 is supplied with the data voltage Vdata through the switching transistor Q12 which is conductive, the detecting transistor Q14 and light emission controlling transistor Q13 are respectively maintained turned on.

Within or subsequent to the time t1, the supply of a current, responsive to the conduction state of the driving transistor Q11, to the organic EL element starts.

The light emission controlling transistor Q13 is then turned off, thereby suspending the supply of the current to the organic EL element, and the electronic device waits on standby until the start of a next data write cycle.

For a duration of time during which the pixel circuit 20 is supplied with the data voltage Vdata through the switching transistor Q12, it does not matter whether the detecting transistor Q14 is turned on or off.

However, since there is a possibility that an extremely small current flowing from the data line Xm to the pixel circuit 20 through the conductive detecting transistor Q14 may fluctuate the data voltage Vdata, the detecting transistor Q14 is preferably turned off for the duration throughout which the pixel circuit 20 is supplied with the data voltage Vdata through the switching transistor Q12, as in this exemplary embodiment.

It is also acceptable if the detecting transistor Q14 remains off throughout the standard operation mode.

In this exemplary embodiment, the light emission controlling transistor Q13 and detecting transistor Q14 are arranged in a complementary circuit structure. Alternatively, the two transistors may be independently controlled.

By repeating the above operation, the organic EL element 21 in the pixel circuit 20 in each of the scanning lines Y1–Yn is controlled in the emission operation thereof at luminance responsive to the data voltage Vdata. The organic EL display 10 thus presents an image based on the display data from the computer 18.

(Test Mode)

A test mode, which is one aspect of the driving method, is discussed below. Upon being connected to the testing device 19, the organic EL display 10 is switched to the test mode. When the testing device 19 outputs the test display data to the organic EL display 10, the control circuit 17 is switched to the test mode. The control circuit 17 converts the test display data into (test) matrix data representing luminance gradation of each organic EL element 21 emitting light. The control circuit 17 then outputs the test scanning line driving signal and test data line driving signal to the scanning line driving circuit 13 and data line driving circuit 12, respectively.

Figure 5:
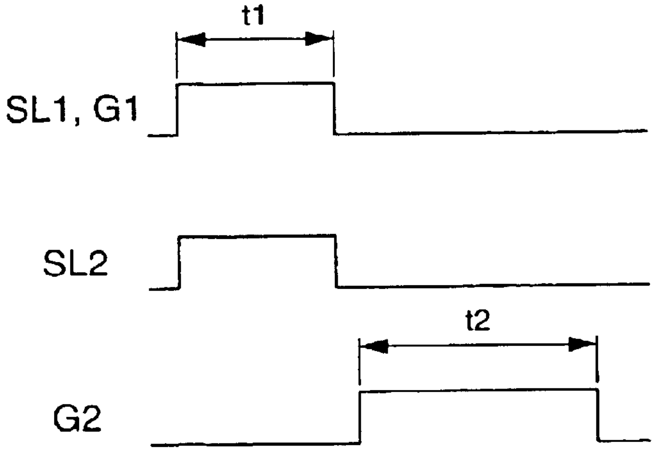
FIG. 5 is a timing diagram showing signals in a test mode.

FIG. 5 is a timing diagram illustrating signals SL1, SL2, G1, and G2 in the test mode, For example, the scanning line driving circuit 13 outputs, to the first sub-scanning line Va of the scanning line Yn, the first selection signal SL1 to turn on the switching transistor Q12, thereby turning on the switching transistor Q12 in each pixel circuit 20 arranged on the scanning line Yn. At the same time, the control circuit 17 outputs, to each switching circuit 16*a* in the selecting circuit 16*a* in the selecting circuit 16, the first gate signal G1 to turn on the first gate transistor Q1. The first gate transistor Q1 in each of the switching circuit 16*a* is thus turned on.

The holding capacitor Cl receives the test data voltage Vdata from the data voltage generating circuit 12*a* through the switching transistor Q12 and first gate transistor Q1. For the duration of time throughout which the test data voltage Vdata is supplied, the second selection signal SL2 is fed to the detecting transistor Q14 to turn off the detecting transistor Q14.

After the time t1 has elapsed, the first selection signal SL1 and first gate signal G1 for respectively turning off the switching transistor Q12 and first gate transistor Q1 are supplied, thereby ending the data write period in the pixel circuit 20. The second selection signal SL2 to turn on the detecting transistor Q14 and for turning off the light emission controlling transistor Q13 is then supplied.

Next, the control circuit 17 supplies the switching circuit 16*a* in the selecting circuit 16 with the second gate signal G2 to turn on the second gate transistor Q2, thereby turning on the second gate transistor Q2. In response to the conduction of the second gate transistor Q2, a driving current having a current value corresponding to the test data voltage Vdata based on the operation of the driving transistor Q11 flows through the pixel circuit 20. The driving current from the driving transistor Q11 is output to the current detecting circuit 19*a* in the testing device 19, arranged for the respective pixel circuit 20 of the scanning line Yn, through the detecting transistor Q14 and second gate transistor Q2.

Then, the above-described operation is successively performed for the pixel circuits 20 of the scanning lines Y1–Yn, and the driving current is output to each of the current detecting circuits 19*a* respectively arranged for the pixel circuits 20 of the scanning lines Y1–Yn.

Each of the current detecting circuits 19*a* in the testing device 19 arranged for the pixel circuits 20 on the scanning lines Y1–Yn analog-to-digital converts input currents and obtain currents to output as detected digital current values. The testing device 19 then compares the detected current values of the pixel circuits 20 determined by the respective current detecting circuits 19*a* with set current values to the test data voltage Vdata. The testing device 19 temporarily stores the comparison result. The set current value is the rated one the pixel circuit 20 must output in response to the test data voltage Vdata, and is obtained beforehand theoretically or based on tests.

After the comparison result is temporarily stored, the same test is carried out on the organic EL display 10 using data voltage Vdata having new and different values. In the same way as described above, the testing device 19 compares the detection current values of the pixel circuits 20 determined by the current detecting circuits 19*a* with the set current values responsive to the test data voltage Vdata, and then stores the comparison result.

Based on the comparison result responsive to the two different pieces of test data voltage Vdata, the testing device 19 tests the output current characteristics of the driving transistor Q11 in the pixel circuit 20 in response to the data voltage Vdata. The testing device 19 determines a correction value for each pixel circuit 20 so that each pixel circuit 20 exhibits target (rated) characteristic. Specifically, the correction value ΔVd to the data voltage Vdata to achieve the set luminance is determined for each of the pixel circuits 20.

The testing device 19 outputs, to the organic EL display 10, the correction value ΔVd determined for each of the pixel circuits 20. The correction value ΔVd determined for each of the pixel circuits 20 is stored in a memory 17*a* of non-volatile type built in the control circuit 17, and the test mode is completed. In this exemplary embodiment, the correction value ΔVd is stored in the memory 17*a*. Alternatively, fuses for setting a correction value may be arranged, and a fuse matching the test result of the testing device 19 may be cut.

The control circuit 17 uses the correction value ΔVd when the display data (image data) from the computer 18 is converted into the matrix data representing the luminance gradation of the light emitting organic EL element 21. More specifically, the control circuit 17 corrects, with the respective correction value ΔVd, the data voltage Vdata setting the luminance of the organic EL element 21 in the pixel circuit 20 determined in response to the display data, and regards the corrected data as new data voltage Vdata. The control circuit 17 outputs the new data voltage Vdata of the pixel circuit 20 to the data line driving circuit 12 as the data line driving signal.

Variations in the operational characteristics of each pixel circuit (the transistors; the driving transistor Q11 in particular) due to manufacturing variations can be detected. Moreover, the variations in the operation characteristics of each pixel circuit can be corrected to make the luminance of the organic EL element 21 in each pixel circuit 20 uniform to the data voltage Vdata.

If the testing device 19 is adapted to determine that the pixel circuit 20 fails to operate normally when the detection current value falls outside a rated range, this serves the basis to determine whether to ship the product.

The organic EL display 10 thus constructed has the following features.

(1) The pixel circuit 20 includes the light emission controlling transistor Q13 and detecting transistor Q14 in the above-referenced exemplary embodiment. During the test mode, the current detecting circuit 19*a* in the testing device 19 is supplied with the driving current having the current value responsive to the test data voltage Vdata from the driving transistor Q11 through the detecting transistor Q14.

Therefore, the operational characteristics of the pixel circuit 20 due to manufacturing variations are easily detected. As a result, a faulty organic EL display 10 can be found prior to shipment.

(2) In the above-referenced exemplary embodiment, the memory 17*a* in the control circuit 17 stores the correction value to correct the error in the operational characteristics due to manufacturing variations, i.e., the correction value ΔVd to the data voltage Vdata setting luminance determined by the testing device 19 for each pixel circuit 20. The control circuit 17 corrects, with the correction value ΔVd, the data voltage Vdata setting the luminance of the organic EL element 21 in the pixel circuit 20 determined based on the display data.

Accordingly, in response to the data voltage Vdata based on the display data, the organic EL element 21 in the pixel circuit 20 is supplied with the driving current at a uniform current value. The individual organic EL elements 21 thus uniformly emit light. Moreover, since the operational characteristics of each pixel circuit 20 due to the manufacturing variations are corrected with the correction value ΔVd, organic EL displays, which could be discarded as defective in the conventional art, are improved to an acceptable level. The manufacturing yield of the organic EL display is thus heightened.

(3) In the above-referenced exemplary embodiment, the driving current for testing purpose is fed to the current detecting circuit 19*a* using the existing data lines X1–Xm. This arrangement prevents the scale of the circuit from being enlarged regardless of the introduction of the current detection function.

In the above-referenced exemplary embodiment, the driving transistor (the second transistor) Q11 and detecting transistor (third transistor) Q14 are connected in series. Another element may be connected between the driving transistor Q11 and detecting transistor Q14. Even in this arrangement, the driving transistor Q11 and detecting transistor Q14 are connected in series.

(Second Exemplary Embodiment)

A second exemplary embodiment is discussed below. In the first exemplary embodiment, the testing device 19 is an external component. In the second exemplary embodiment, the testing device 19 is arranged as an element like the components 11–17 in the organic EL display 10 of the first exemplary embodiment. The testing device 19 is thus housed together with the organic EL display 10 in electronic equipment, such as a mobile telephone, PDA, notebook computer.

The feature of the second exemplary embodiment is that the testing device 19 is housed in the mobile electronic equipment. For convenience of explanation, the discussion of components identical to those of the first exemplary embodiment is omitted, and only the difference of the second exemplary embodiment from the first exemplary embodiment is discussed below.

Figure 6:
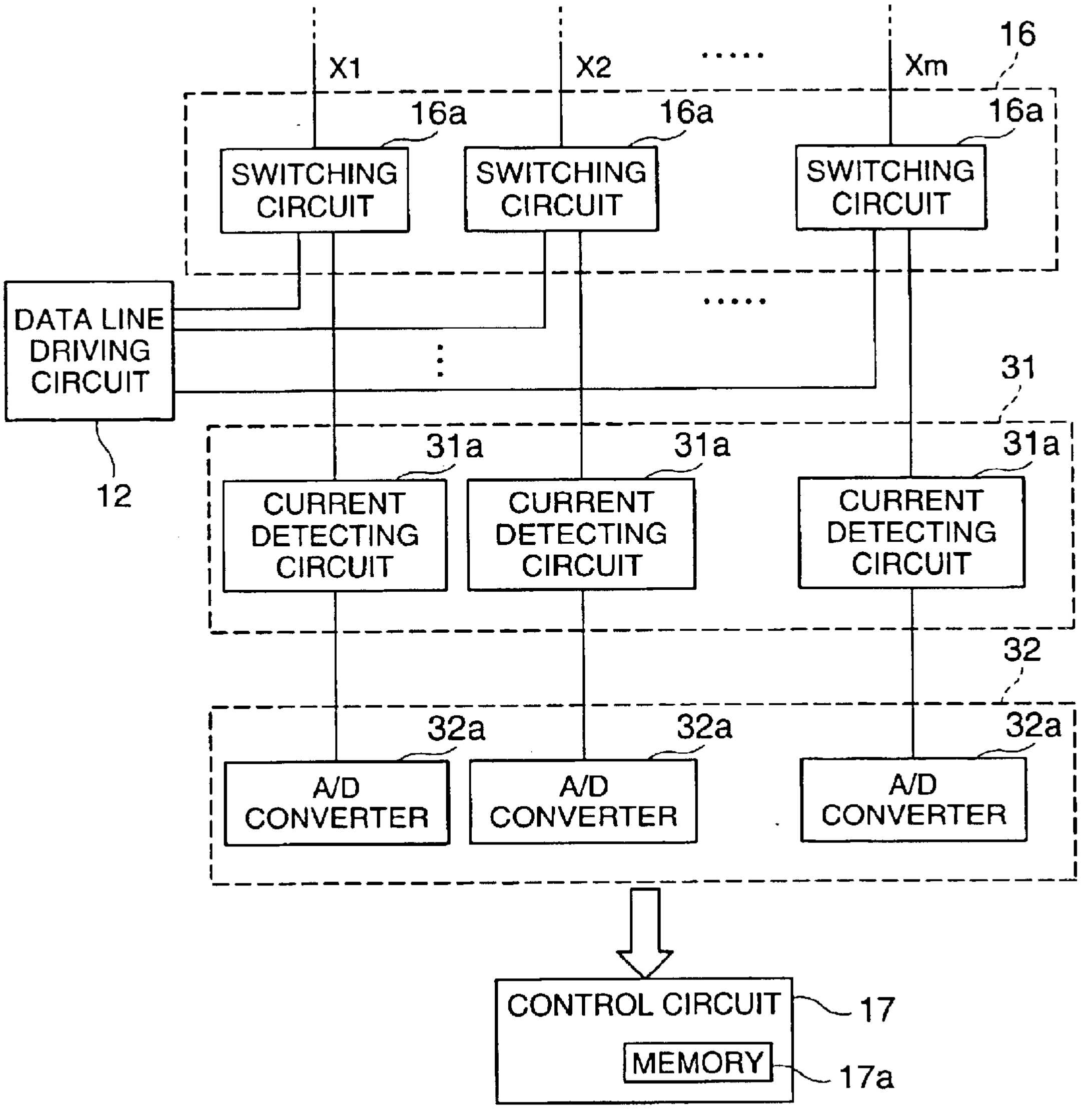
FIG. 6 is a schematic of a significant portion of a second exemplary embodiment.

FIG. 6 is a circuit diagram of the testing device 19 of the second exemplary embodiment.

As shown in FIG. 6, a current detecting unit 31 includes current detecting circuits 31*a* arranged corresponding to the data lines X1–Xm. Each current detecting circuit 31*a* detects an analog driving current in response to the test data voltage Vdata supplied from the driving transistor Q11 through each of the data lines X1–Xm and the switching circuit 16*a*. The test display data is stored beforehand in the memory 17*a* in the control circuit 17.

Each current detecting circuit 31*a* is connected to a corresponding A/D converter 32*a* in an A/D converter unit 32. The A/D converters 32*a* convert the current values of the driving current supplied through the data lines X1–Xm to digital values and outputs the digital values to the control circuit 17.

The control circuit 17 compares the current values of the driving currents supplied from the data lines X1–Xm through the A/D converters 32*a* with the set current values against the test data voltage Vdata. The control circuit 17 temporarily stores the comparison result. That is, in the second exemplary embodiment, the control circuit 17 performs the same test operation as that carried out by the testing device 19 in the first exemplary embodiment. In the second exemplary embodiment, the pixel circuits 20 connected to one scanning line are tested and then the pixel circuits 20 connected to a next scanning line are tested next.

After the comparison result is temporarily stored, the same test is carried out on the organic EL display 10 using test data voltage Vdata having new and different values. In the same way as described above, the control circuit 17 compares the current values of the driving currents supplied from the data lines X1–XM through the A/D converters 32*a* with the set current values responsive to the test data voltage Vdata, and then stores the comparison result.

Based on the comparison result responsive to the two different pieces of test data voltage Vdata, the control circuit 17 tests the output current characteristics of the driving transistor Q11 in the pixel circuit 20 in response to the data voltage Vdata. The control circuit 17 determines a correction value for each pixel circuit 20 so that each pixel circuit 20 exhibits target (rated) characteristic. Specifically, the correction value ΔVd to the data voltage Vdata to achieve the set luminance is determined for each of the pixel circuits 20. The control circuit 17 stores the determined correction value ΔVd in the memory 17*a* as a memory circuit, and ends the test mode. The control circuit 17 is designed to perform the test mode operation periodically or immediately subsequent to power on. The control circuit 17 controls the driving of the pixel circuit 20 based on the display data using the correction value ΔVd as in the first exemplary embodiment.

The organic EL display 10 thus constructed has the following features.

(1) The pixel circuit 20 includes the light emission controlling transistor Q13 and detecting transistor Q14 in the above-referenced exemplary embodiment. During the test mode, the control circuit 17 is supplied with the driving current having the current value responsive to the test data voltage Vdata from the driving transistor Q11 through the detecting transistor Q14.

The control circuit 17 detects the operational characteristics of the pixel circuit 20. Without a large-scale testing device, the operational characteristics of the pixel circuit 20 due to manufacturing variations are easily detected. If the control circuit 17 is designed to perform the test mode operation periodically or immediately subsequent to power on, the operational characteristics of the pixel circuit 20 due to aging and a change in ambient temperature are detected.

(2) In the above-referenced exemplary embodiment, the memory 17*a* in the control circuit 17 stores the correction value determined by the control circuit 17 for each pixel circuit 20 to correct the error in the operational characteristics due to manufacturing variations, aging, and a change in ambient temperature, i.e., the correction value ΔVd to the data voltage Vdata to obtain the set luminance. The control circuit 17 corrects, with the correction value ΔVd, the data voltage Vdata setting the luminance of the organic EL element 21 in the pixel circuit 20 determined based on the display data Accordingly, even if the pixel circuit 20 is subject to aging and a change in ambient temperature, the pixel circuit 20 can supply the organic EL element 21 with the driving current at a uniform current value in response to the data voltage Vdata based on the display data, thereby causing individual EL elements to uniformly emit light.

(3) In the above-referenced exemplary embodiment, the driving current for testing purpose is fed to the current detecting circuit 19*a* using the existing data lines X1–Xm. This arrangement prevents the scale of the circuit from being enlarged regardless of the introduction of the current detection function.

(Third Exemplary Embodiment)

Application of the organic EL display 10 as the electro-optical device discussed in connection with the first and second exemplary embodiments to electronic equipment is discussed below with reference to FIG. 7 and FIG. 8. The organic EL display 10 may be applied to electronic equipment, such as a mobile computer, mobile telephone, digital camera, etc.

Figure 7:
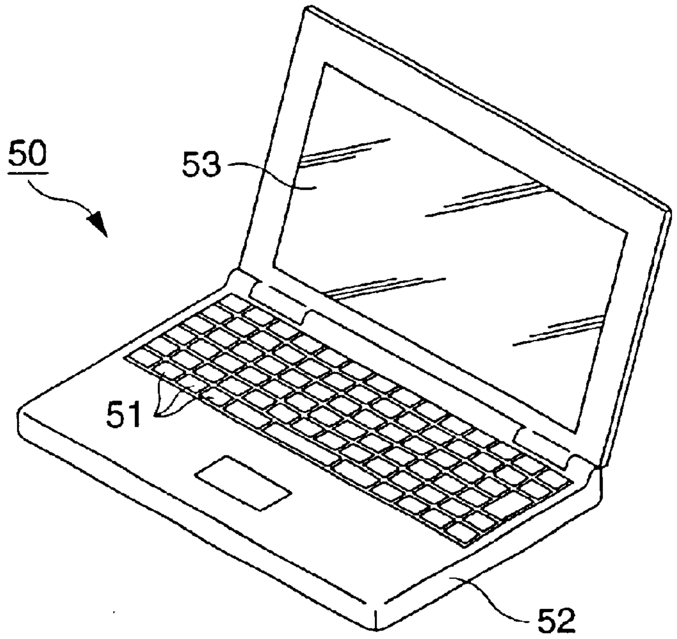
FIG. 7 is a perspective view of a mobile computer in accordance with a third exemplary embodiment of the present invention.

FIG. 7 is a perspective view of a mobile computer. The mobile computer 50 includes a main unit 52 having a keyboard 51, and a display unit 53 employing the organic EL display 10. The display unit 53 employing the organic EL display 10 provides the sane advantages as the preceding exemplary embodiments. As a result, the mobile computer 50 presents a display with less defects.

Figure 8:
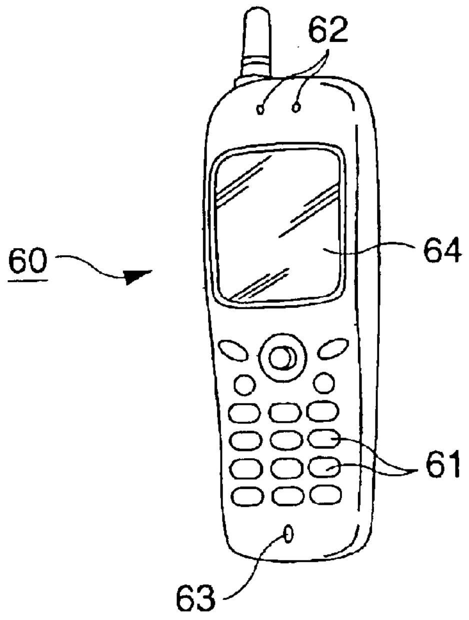
FIG. 8 is a perspective view of a mobile telephone of the third exemplary embodiment.

FIG. 8 is a perspective view of a mobile telephone. As shown in FIG. 8, the mobile telephone 60 includes a plurality of control buttons 61, a earpiece 62, a mouthpiece 63, and a display unit 64 employing the organic EL display 10. The display unit 64 employing the organic EL display 10 provides the same advantages as the preceding exemplary embodiments. As a result, the mobile telephone 60 presents a display with less defects.

(Fourth Exemplary Embodiment)

A fourth exemplary embodiment including a switching transistor also working as a detecting transistor is discussed with reference to a pixel circuit shown in FIG. 9.

Figure 9:
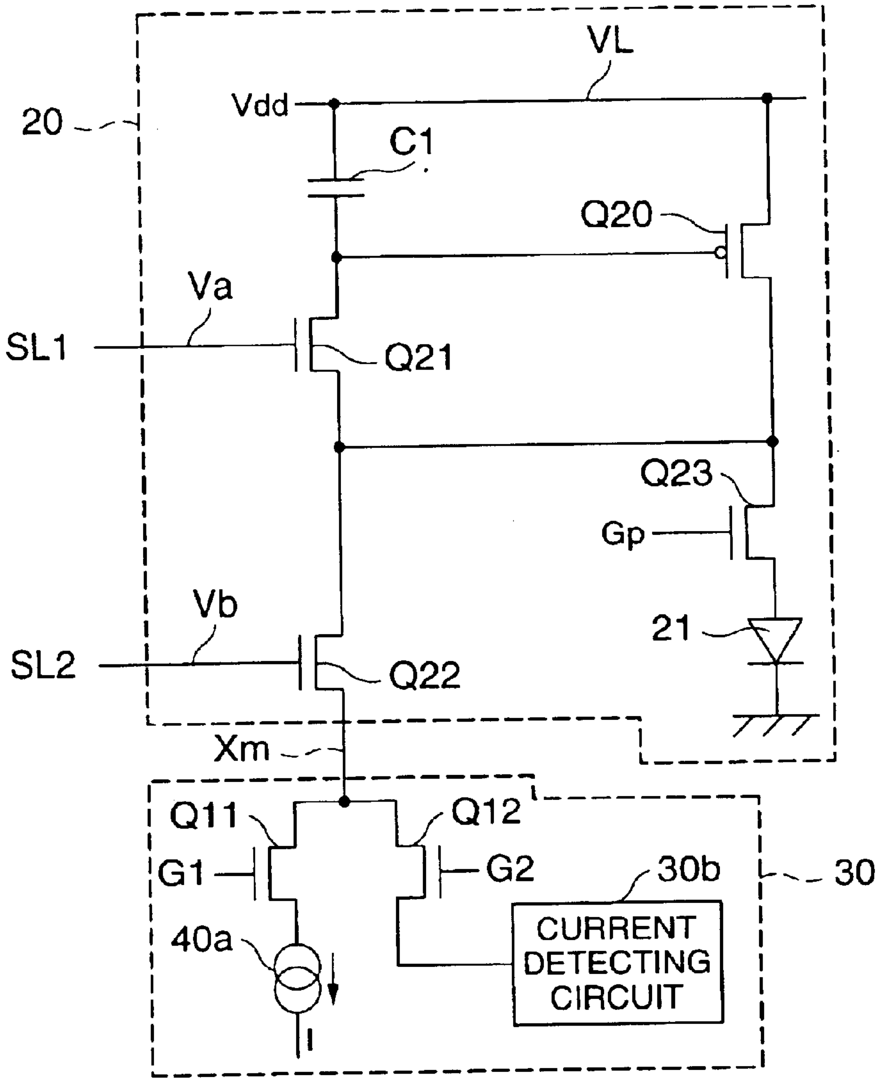
FIG. 9 is a schematic showing an internal circuit diagram of a pixel circuit in accordance with a fourth exemplary embodiment of the present invention.

As shown in FIG. 9, the pixel circuit 20 includes a driving transistor Q20 as a second transistor, first switching transistor Q21, second switching transistor Q22, light emission controlling transistor Q23, and holding capacitor C1 as a holding element. The driving transistor Q20 is formed of a P-channel TFT. Each of the first and second switching transistors Q21 and Q22, and light emission controlling transistor Q23 is formed of an N-channel TFT.

The driving transistor Q20 has the drain thereof connected to the anode of the organic EL element 21 through the light emission controlling transistor Q23, and the source thereof connected to a power source line L1. A driving voltage Vdd for driving the organic EL element 21 is fed to the power source line VL. The holding capacitor C1 is connected between the gate of the driving transistor Q20 and the power source line VL.

The driving transistor Q20 has the gate thereof connected to the drain of the first switching transistor Q21. The source of the first switching transistor Q21 is connected to the drain of the second switching transistor Q22. The drain of the second switching transistor Q22 is connected to the drain of the driving transistor Q20.

The source of the second switching transistor Q22 is connected to a single-line driving circuit 30 in the data line driving circuit 12 through the data line Xm. The single-line driving circuit 30 includes a data current generating circuit 40*a*. The data current generating circuit 40*a* outputs a data signal I to the pixel circuit 20. The data line Xm is connected to the data current generating circuit 40*a* through a first switch Q11 while also being connected to a current detecting circuit 30*b* through the second switch Q12.

A first sub-scanning line Va and second sub-scanning line Vb are respectively connected to the gates of the first switching transistor Q21 and second switching transistor Q22. A first selection signal SL1 and second selection signal SL2 respectively from the first sub-scanning line Va and second sub-scanning line Vb respectively turn on the first switching transistor Q21 and second switching transistor Q22. The gate of the light emission controlling transistor Q23 is controlled by a light emission controlling signal Gp second.

The data current generating circuit 40a outputs the data signal I through the data line Xm for a duration of time throughout which the first switch Q11, first switching transistor Q21, and second switching transistor Q22 are turned on. The data signal I is fed to the pixel circuit 20. The holding capacitor C1 stores an electric charge corresponding to the data signal I. The driving transistor is set to be in the conductive state. This is a write operation.

In succession, the light emission controlling transistor Q23 is turned on in response to the light emission controlling signal Gp for turning on the light emission controlling transistor Q23, and the organic EL element 21 is supplied with the amount of current in response to the conductive state of the driving transistor Q20.

On the other hand, during the test mode, the write operation is substantially identical to the one described above, but the holding capacitor holds an electric charge corresponding to a test signal instead of normal data signal. The second switching transistor Q22 and second switch Q12 are turned on with the first switching transistor Q21, first switch Q11, and light emission controlling transistor Q23 remaining turned off. The amount of current flowing through the driving transistor Q20 is detected by the current detecting circuit 30*b*.

Unlike the first exemplary embodiment, the fourth exemplary embodiment employs one of the two switching transistors (the second switching transistor Q22) as a detecting transistor as well, instead of newly arranging a detecting transistor.

It is understood that the present invention is not limited to the above-referenced exemplary embodiments, and may be embodied as described below.

In the first exemplary embodiment, the testing device 19 is used to test the organic EL display prior to shipment. When a battery of mobile electronic equipment, such as a mobile telephone, PDA, and notebook computer, is charged by a battery charger, the organic EL display mounted on the mobile electronic equipment may be tested using the testing device 19. In this case, the testing device 19 needs to be built in the battery charger. When a charging operation starts, the electronic equipment is set to the test mode with the current of the pixel circuit 20 detected. The operational characteristics of the pixel circuit 20 due to aging in the organic EL display mounted on the mobile electronic equipment is corrected each time the charging operation is performed on the electronic equipment.

In the above-referenced exemplary embodiments, the testing device 19 has the current detecting circuit 19*a* arranged for each of the pixel circuits 20 in the display panel 11. However, the current detecting circuits 19*a* of the same number as the data lines X1–Xm may be arranged as in the second exemplary embodiment. In this case, as discussed in connection with the second embodiment, one row of pixel circuits 20 connected to one scanning line is tested and a next row of pixel circuits 20 connected to a next scanning line is then tested.

In the first exemplary embodiment, the correction value Vd determined by the testing device 19 is stored in the memory 17*a* in the control circuit 17, and the new data voltage Vdata is produced using the correction value Vd stored in the memory 17*a*.

In the above-referenced exemplary embodiments, the present invention embodied in the pixel circuit 20 as an electronic circuit provides the advantages. The present invention may be applied to an electronic circuit which drives a driven element such as an LED or FED other than the organic EL element 21. The driven element may be a magnetic RAM. The present invention is thus applied to a memory device employing a magnetic RAM.

To determine the correction value ΔVd in the above-referenced exemplary embodiments, the two different pieces of test data voltage Vdata are used to test the device. Alternatively, one piece of test data voltage Vdata or three or more pieces of test data voltage Vdata may be used to determine the correction value ΔVd.

In the above-referenced exemplary embodiments, the currents are fed to the current detecting circuits through the data lines X1–Xm. Alternatively, a dedicated detecting line may be arranged on the detecting transistor Q13, and the current is fed to the current detecting circuit 1 through this line.

In the above-referenced exemplary embodiments, the driven element in the pixel circuit is the organic EL element 21. The driven element may be an inorganic EL element. Specifically, the present invention may be applied to an inorganic EL display.

In the above-referenced exemplary embodiment, the pixel circuit 20 is the pixel circuit of voltage driven type. The present invention may be applied to an organic EL display of a pixel circuit of a current driven type. The present invention may be applied to an organic EL display of a pixel circuit which is digitally driven in a time-division manner or area gradation manner.

What is claimed is:

1. An electronic device usable with a tester, comprising:

a plurality of unit circuits, each of the unit circuits including:

a first transistor;

a holding element to hold an electrical signal, supplied through the first transistor, as an amount of electricity;

a second transistor having a conduction state that is controlled in accordance with the amount of electricity held by the holding element;

a driven element which is supplied with an amount of current responsive to the conduction state; and a third transistor which is connected in series with the second transistor, the electronic device being connectable through the third transistor to the tester which detects the amount of current.

2. An electronic device usable with a tester, comprising:

a plurality of unit circuits, each of the unit circuits including:

a first transistors;

a holding element to hold an electrical signal, supplied through the first transistor, as an amount of electricity;

a second transistor having a conduction state that is controlled in accordance with the amount of electricity held by the holding element; and a driven element which is supplied with an amount of current responsive to the conduction state;

the second transistor being connected in series with the first transistor; and the electronic device being connectable through the first transistor to the tester which detects the amount of current.

3. The electronic device according to claim 1, further comprising a fourth transistor connected between the driven element and the second transistor.

4. The electronic device according to claim 1, the driven element being a current driven element.

5. The electronic device according to claim 3, at least the fourth transistor remaining in an off state for a duration throughout which the tester performs a current detecting operation.

6. The electronic device according to claim 1, the third transistor being arranged in each of the unit circuits.

7. The electronic device according to claim 1, further comprising a memory circuit which stores a correction value to an electrical signal fed through the first transistor and determined by the tester.

8. The electronic device according to claim 1, the tester detecting a current flowing through a current passage containing the second transistor, and the current passage excluding the driven element.

9. A driving method of driving an electronic device that includes a first transistor, a holding element to hold an electrical signal, supplied through the first transistor, as an amount of electricity, a second transistor, the conduction state of which is controlled in accordance with the amount of electricity held by the holding element, a driven element which is supplied with an amount of current responsive to the conduction state, and a third transistor connected in series with the second transistor, the driving method comprising:

holding the amount of electricity based on the electrical signal by turning on the first transistor; and detecting the amount of current flowing through a current passage containing the second transistor and the third transistor with the third transistor turned on to electrically connect the second transistor through the third transistor to a tester to detect the amount of current.

10. The driving method for driving the electronic device according to claim 9, the current passage excluding the driven element.

11. An electro-optical device for use with a tester, comprising a plurality of scanning lines;

a plurality of data lines; and a plurality of pixel circuits, each pixel circuit being arranged at an intersection of each of the plurality of scanning lines and each of the plurality of data lines, each pixel circuit including:

a first transistor having a conduction that is controlled by a scanning signal supplied through a corresponding scanning line of the plurality of scanning lines;

a holding element which holds, as an amount of electricity, a data signal supplied through a corresponding data line of the plurality of data lines and the first transistor;

a second transistor having a conduction state that is controlled by the amount of electricity held by the holding element, an electro-optical element supplied with an amount of current responsive to the conduction state; and a third transistor connected in series with the second transistor, each of the plurality of pixel circuits being connected through the third transistor to the tester which detects the amount of current.

12. An electro-optical device for use with a tester comprising:

a plurality of scanning lines;

a plurality of data lines; and a plurality of pixel circuits, each pixel circuit being arranged at an intersection of each of the plurality of scanning lines and each of the plurality of data lines, the pixel circuit including:

a first transistor having a conduction that is controlled by a scanning signal supplied through a corresponding scanning line of the plurality of scanning lines;

a holding element which holds, as an amount of electricity, a data signal supplied through a corresponding data line of the plurality of data lines and the first transistor;

a second transistor having a conduction state that is controlled by the amount of electricity held by the holding element, the second transistor being connected in series with the first transistor; and an electro-optical element supplied with an amount of current responsive to the conduction state;

each of the plurality of pixel circuits being connected through the first transistor to the tester which detects the amount of current.

13. The electro-optical device according to claim 11, the third transistor being connected to the tester through the corresponding data line of the plurality of data lines.

14. The electro-optical device according to claims 11, the tester including:

a current detecting circuit to detect the amount of current, a correction value calculating circuit to determine a correction value to the electrical signal based on the amount of current detected by the current detecting circuit, and a memory circuit to store the correction value to the pixel circuit, the electrical signal being corrected by the correction value.

15. Electronic equipment, comprising:

the electro-optical device according to claim 11.

* * * * *